United States Patent
Watanabe et al.

(10) Patent No.: US 10,546,721 B2
(45) Date of Patent: Jan. 28, 2020

(54) MICROSTRUCTURE MANUFACTURING METHOD AND MICROSTRUCTURE MANUFACTURING APPARATUS

(71) Applicant: Hitachi, Ltd., Chiyoda-ku, Tokyo (JP)

(72) Inventors: Keiji Watanabe, Tokyo (JP); Hiroyasu Shichi, Tokyo (JP); Daisuke Ryuzaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/914,513

(22) Filed: Mar. 7, 2018

(65) Prior Publication Data
US 2018/0261427 A1    Sep. 13, 2018

(30) Foreign Application Priority Data
Mar. 10, 2017   (JP) ................ 2017-046223

(51) Int. Cl.
*H01J 37/317* (2006.01)
*H01J 37/04* (2006.01)
*H01J 37/30* (2006.01)

(52) U.S. Cl.
CPC .......... *H01J 37/317* (2013.01); *H01J 37/045* (2013.01); *H01J 37/30* (2013.01); *H01J 2237/006* (2013.01); *H01J 2237/30472* (2013.01); *H01J 2237/31713* (2013.01)

(58) Field of Classification Search
CPC ....... H01J 2237/317; H01J 2237/31735; H01J 2237/31737; H01J 37/045; H01J 37/317; H01J 2237/30472; H01J 2237/006
See application file for complete search history.

(56) References Cited

U.S. PATENT DOCUMENTS

| 5,639,699 A * | 6/1997 | Nakamura ............. B05D 5/005 427/526 |
| 8,822,945 B2 * | 9/2014 | Nishinaka ............... H01J 37/08 250/309 |
| 9,799,490 B2 * | 10/2017 | Martin ................ H01J 37/3002 |
| 2002/0102861 A1 * | 8/2002 | Bassom ............... C23C 16/047 438/766 |
| 2003/0161970 A1 * | 8/2003 | Kaito ..................... B82Y 30/00 427/595 |
| 2004/0209172 A1 * | 10/2004 | Takaoka ................. C03C 17/28 430/5 |
| 2006/0284115 A1 * | 12/2006 | Kaneoka ................. H01J 37/28 250/492.21 |
| 2007/0205376 A1 * | 9/2007 | Kaito ................. H01J 37/3056 250/435 |

(Continued)

FOREIGN PATENT DOCUMENTS

JP     2011-210492 A     10/2011

*Primary Examiner* — Wyatt A Stoffa
(74) *Attorney, Agent, or Firm* — Crowell & Moring LLP

(57) ABSTRACT

The present invention provides a technology for avoiding radiation of an ion beam at a position other than a desired processing position. A microstructure manufacturing method includes a step of radiating an ion beam to a sample; a step of supplying a gas to the sample; a step of stopping supplying the gas to the sample; and a step of stopping radiating the ion beam to the sample. The step of radiating the ion beam is performed earlier than the step of supplying the gas or the step of stopping supplying the gas is performed earlier than the step of stopping radiating the ion beam.

11 Claims, 14 Drawing Sheets

(56) References Cited

U.S. PATENT DOCUMENTS

| | | | |
|---|---|---|---|
| 2008/0026548 A1* | 1/2008 | Tani | C23C 14/0078 |
| | | | 438/494 |
| 2008/0073586 A1* | 3/2008 | Iwasaki | G01N 23/2251 |
| | | | 250/492.21 |
| 2009/0071605 A1* | 3/2009 | Fukuda | C23C 16/047 |
| | | | 156/345.24 |
| 2009/0152459 A1* | 6/2009 | Buhler | G03F 1/74 |
| | | | 250/306 |
| 2009/0212239 A1* | 8/2009 | Maruo | H01J 37/3056 |
| | | | 250/492.3 |
| 2010/0243889 A1* | 9/2010 | Faber | G01N 1/286 |
| | | | 250/307 |
| 2011/0163068 A1* | 7/2011 | Utlaut | G03F 1/84 |
| | | | 216/66 |
| 2012/0217152 A1* | 8/2012 | Miller | H01J 37/3005 |
| | | | 204/192.34 |
| 2013/0284593 A1* | 10/2013 | Shichi | H01J 27/10 |
| | | | 204/298.03 |
| 2014/0123898 A1* | 5/2014 | Nomaguchi | H01J 37/18 |
| | | | 118/723 FI |
| 2016/0064187 A1* | 3/2016 | Tomimatsu | H01J 37/3023 |
| | | | 250/453.11 |
| 2017/0002467 A1* | 1/2017 | Straw | C23C 16/52 |
| 2018/0197715 A1* | 7/2018 | Gwinn | H01J 37/304 |

* cited by examiner

[Fig. 1]
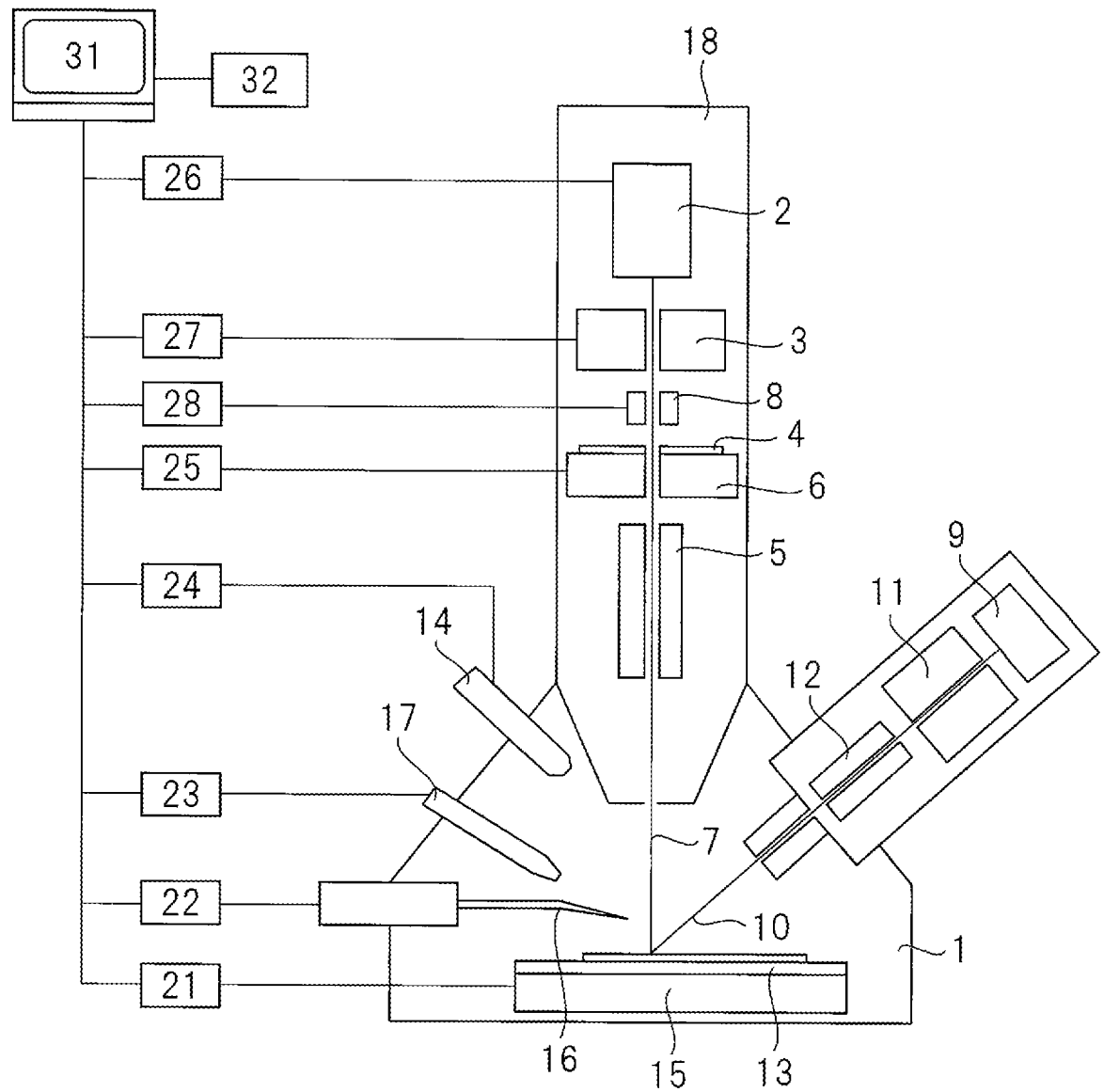

[Fig. 2]
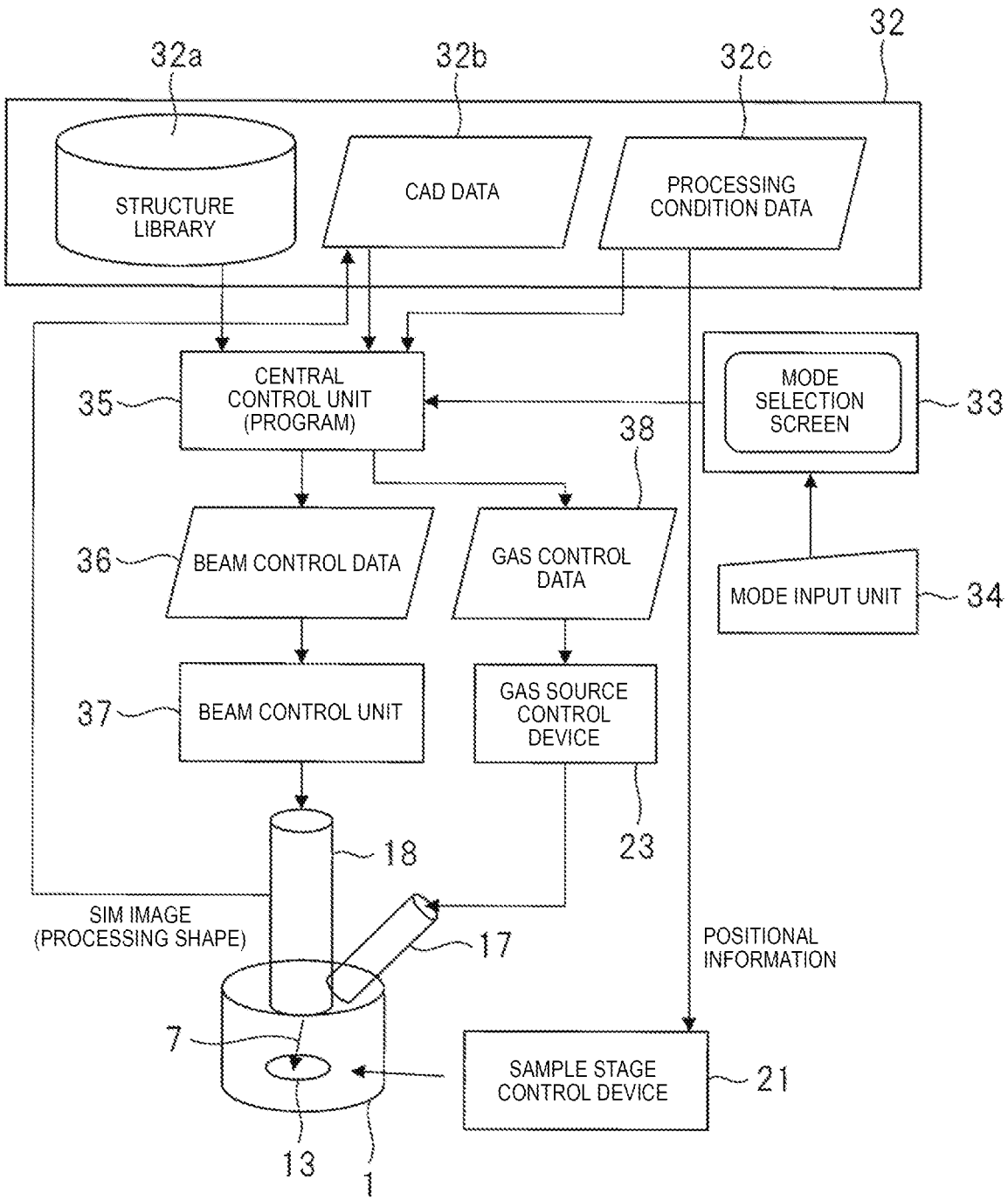

[Fig. 3]
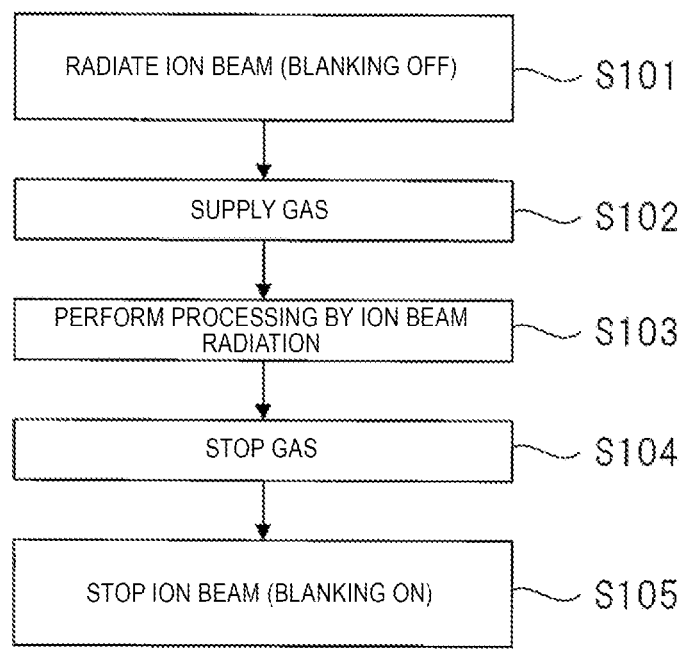

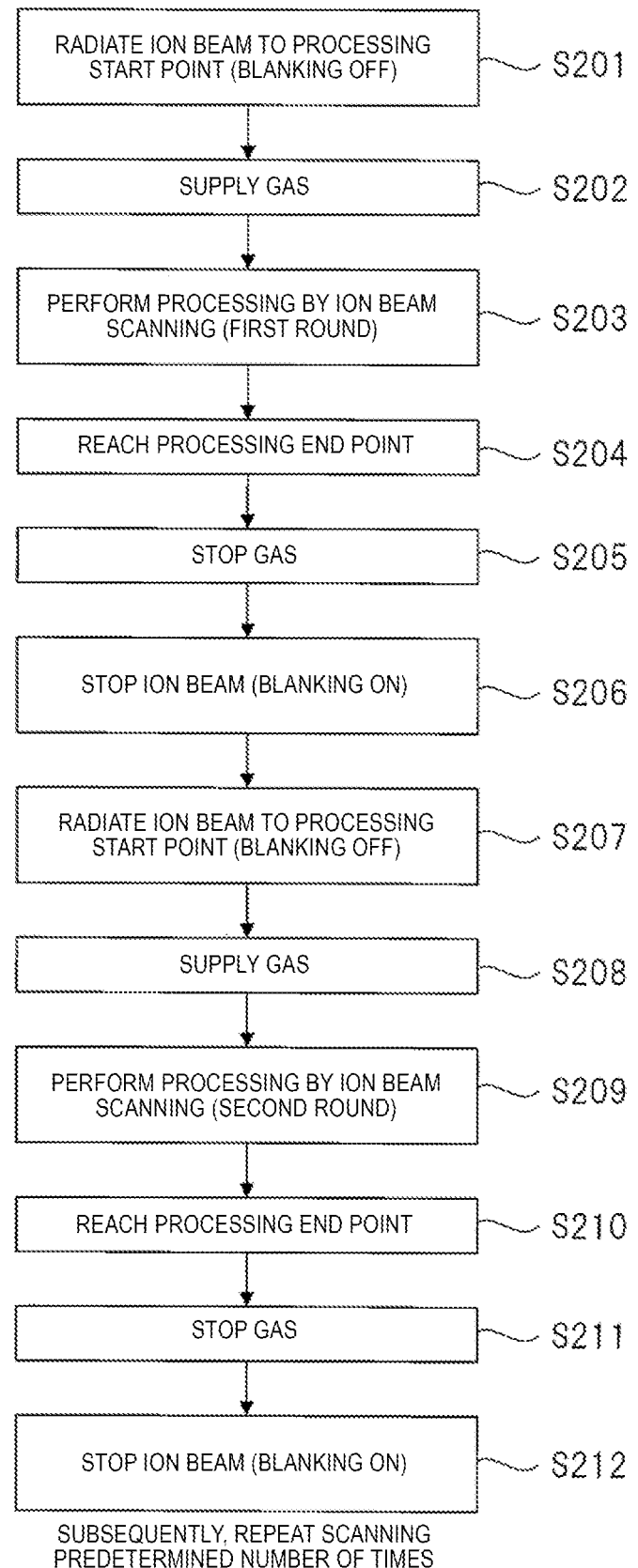
[Fig. 4]

[Fig. 5]
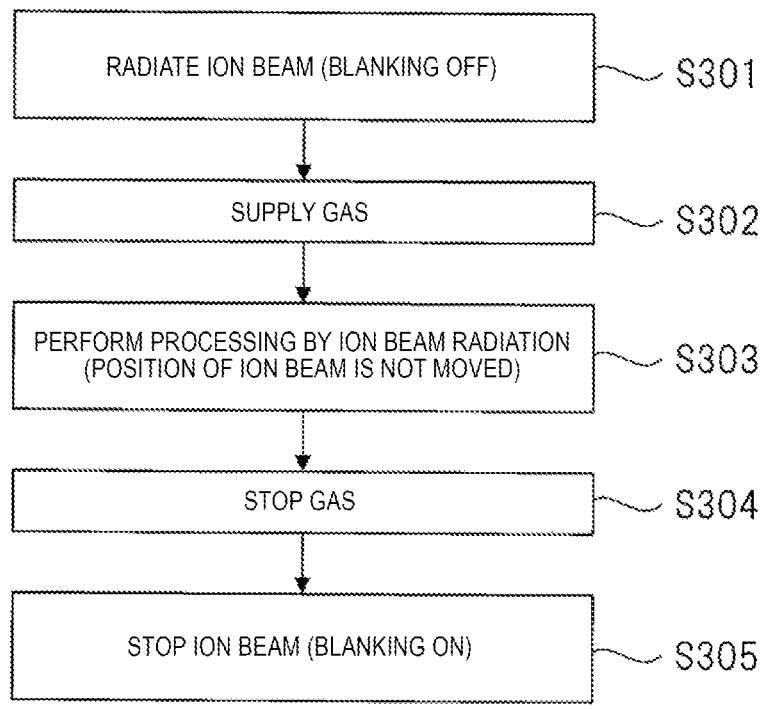

[Fig. 6A]
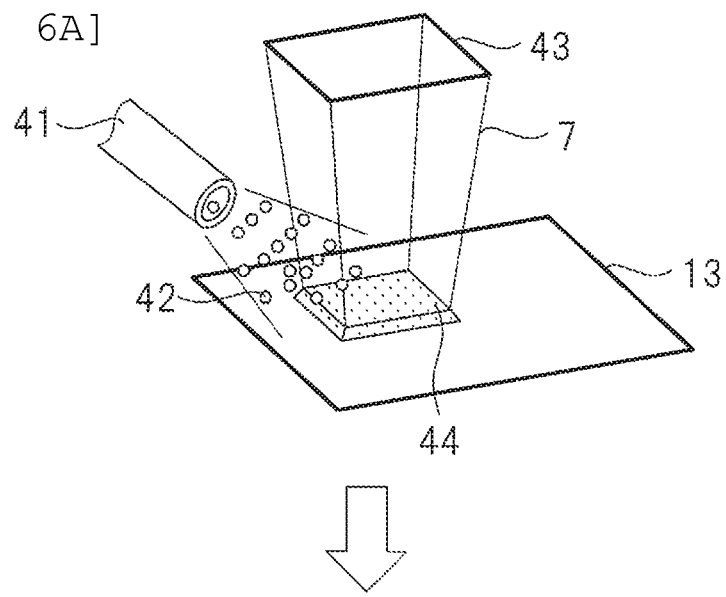
[Fig. 6B]
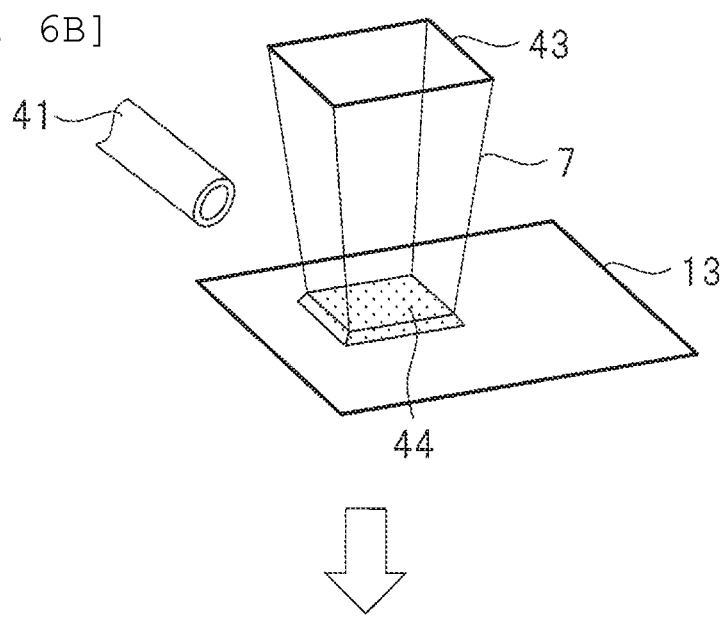
[Fig. 6C]
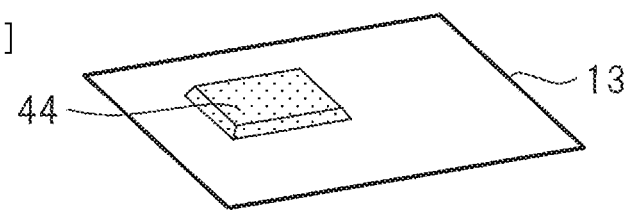

[Fig. 7]
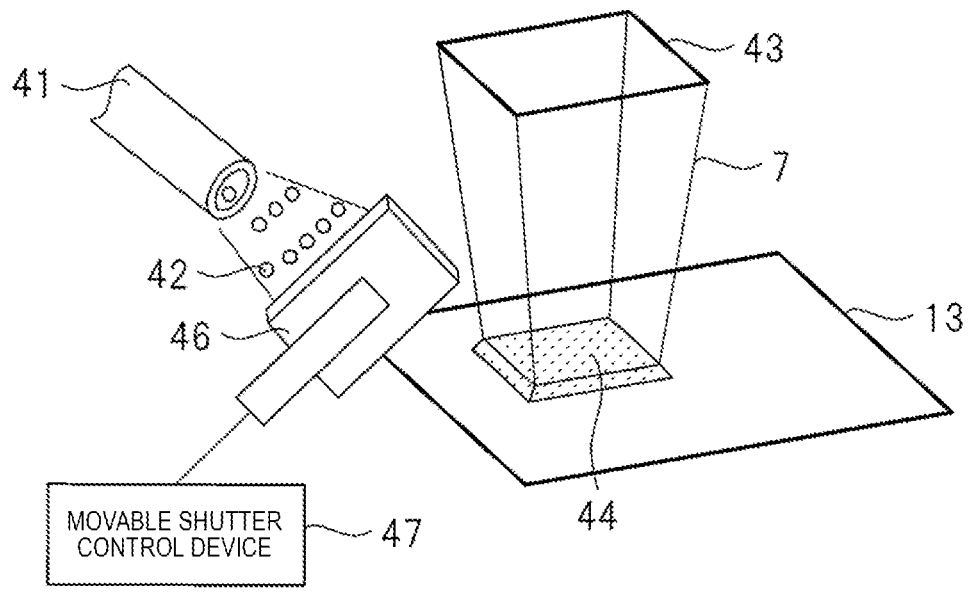
[Fig. 8]
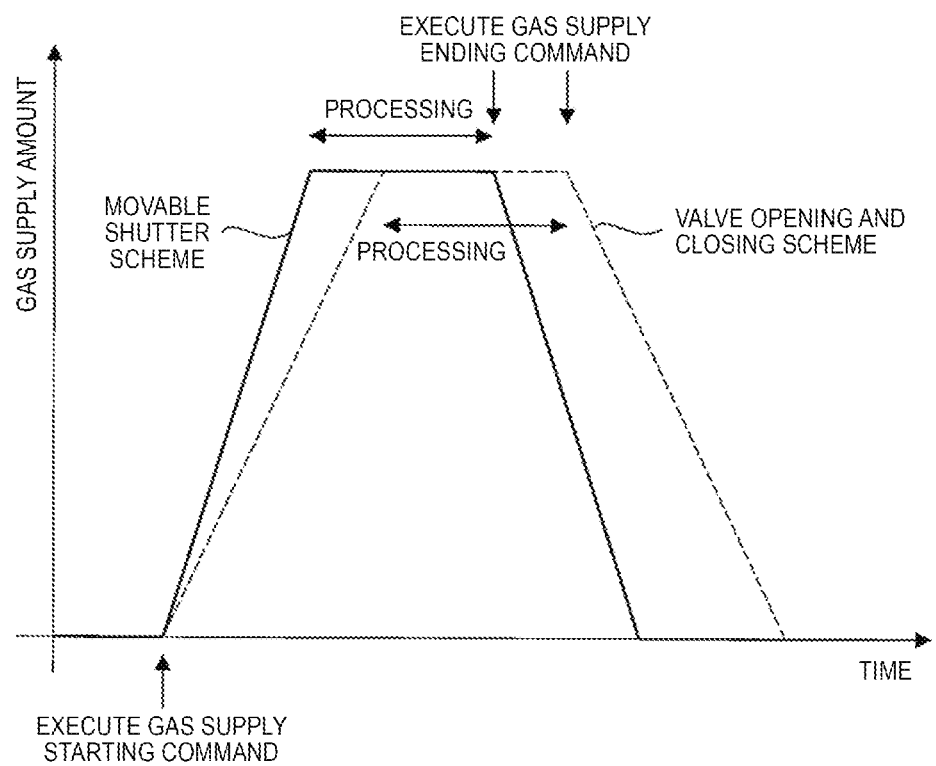

[Fig. 9A]
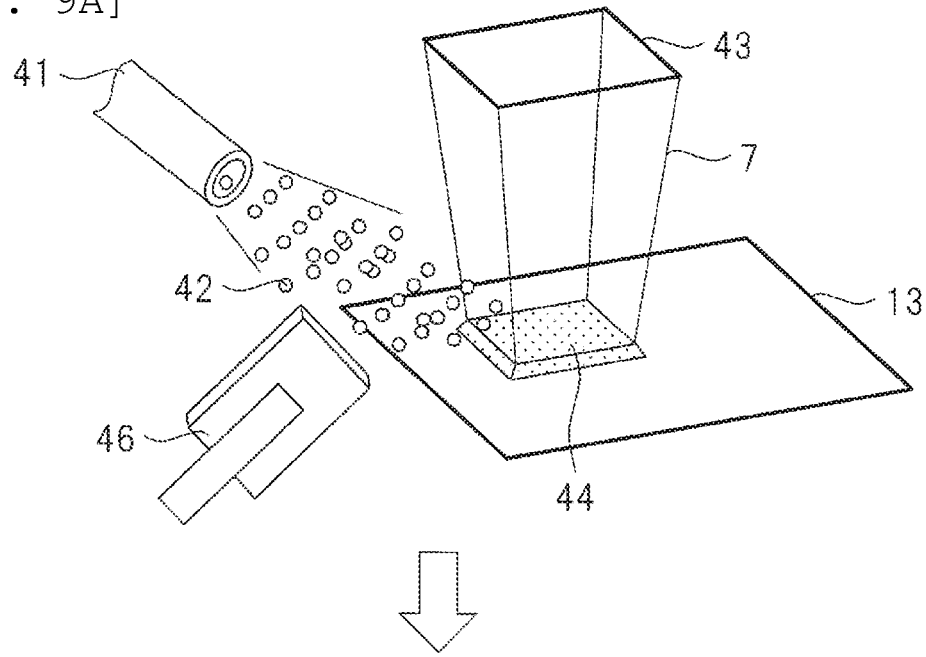
[Fig. 9B]
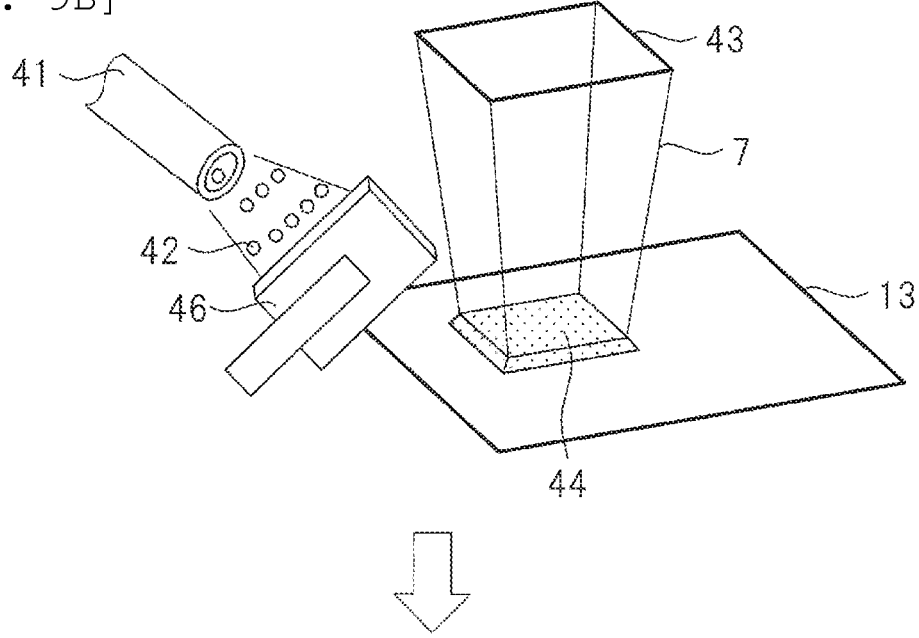
[Fig. 9C]
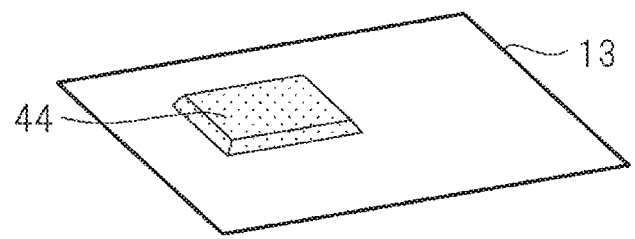

[Fig. 10]
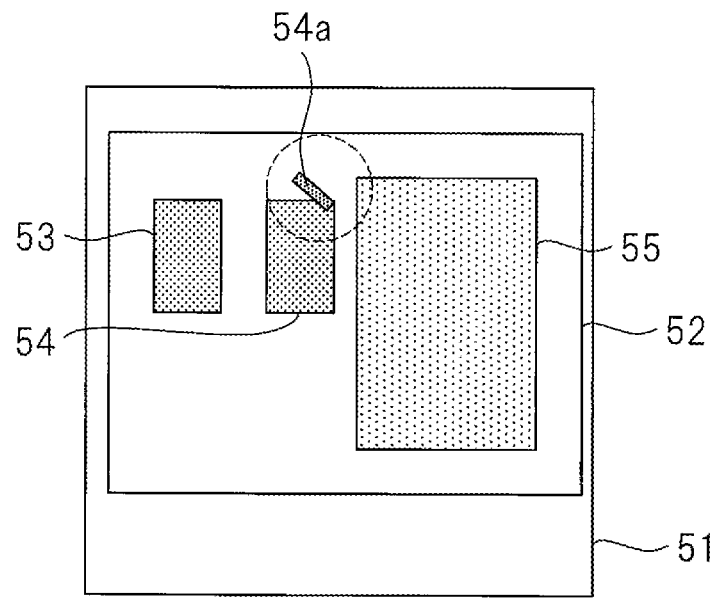
[Fig. 11]
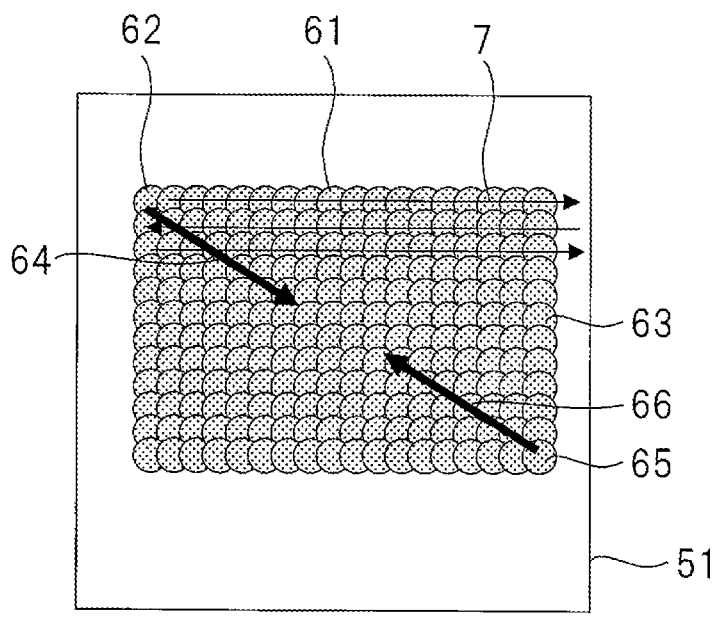

[Fig. 12A]
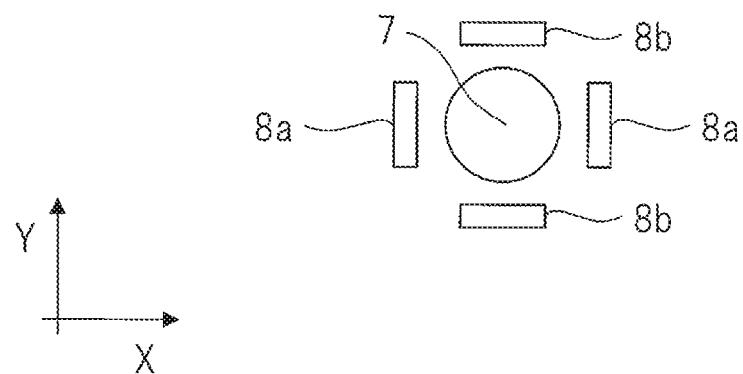
[Fig. 12B]
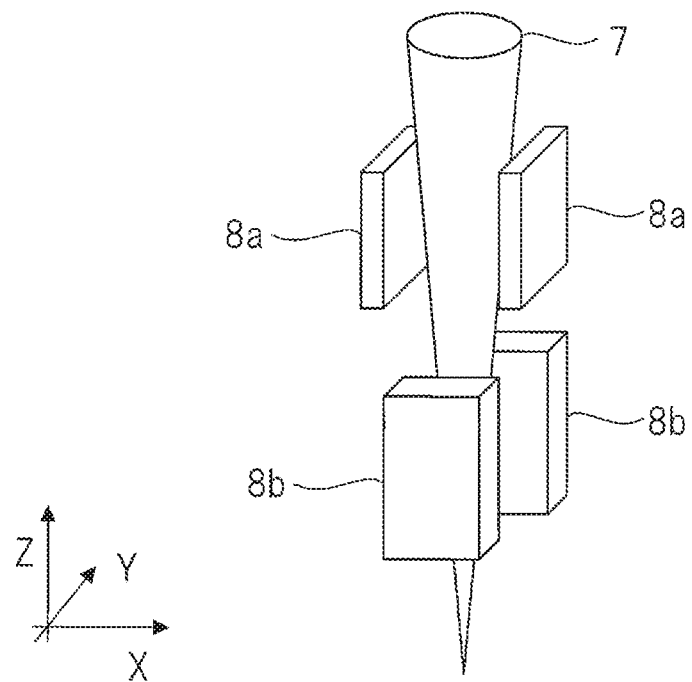

[Fig. 13A]
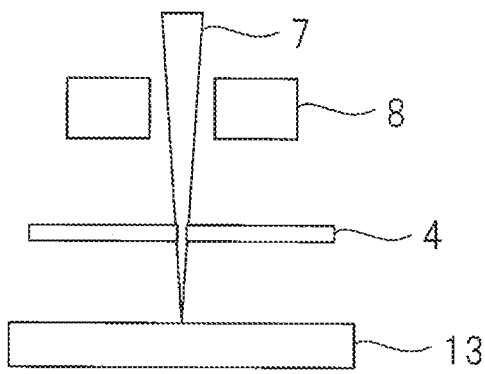
[Fig. 13B]
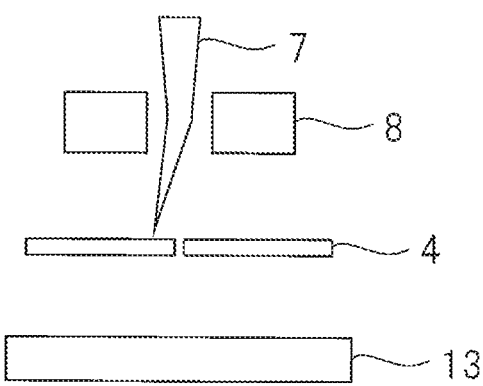

[Fig. 14A]
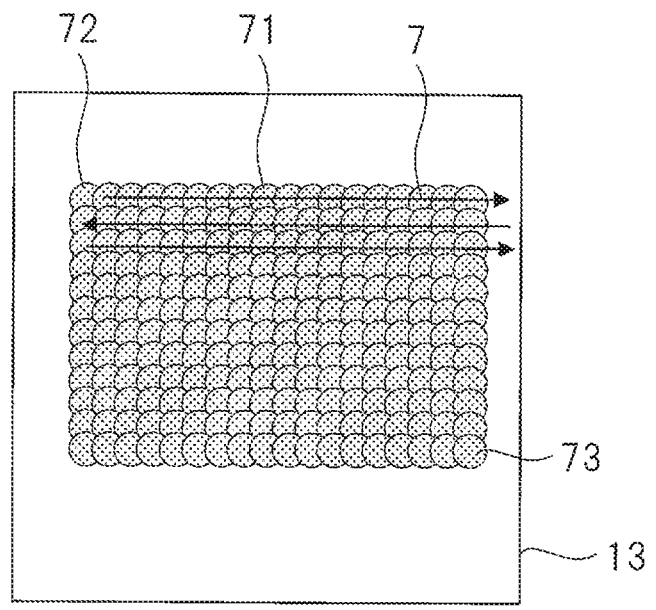
[Fig. 14B]
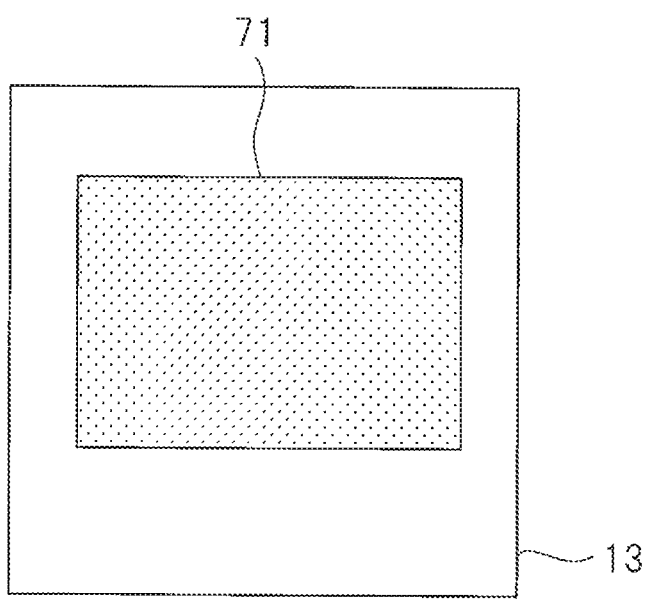

[Fig. 15]
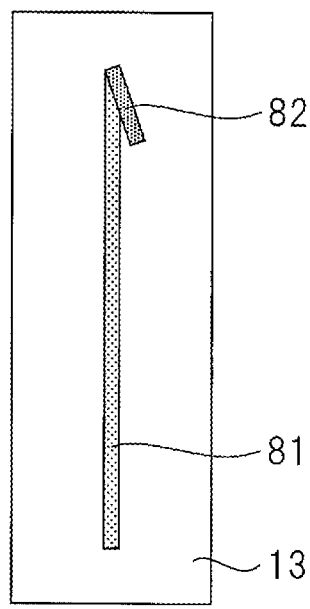
[Fig. 16]
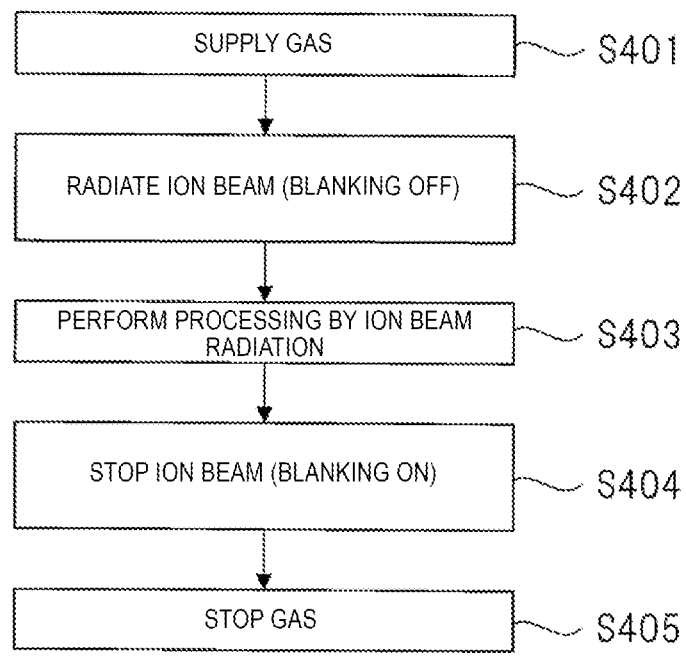

[Fig. 17]
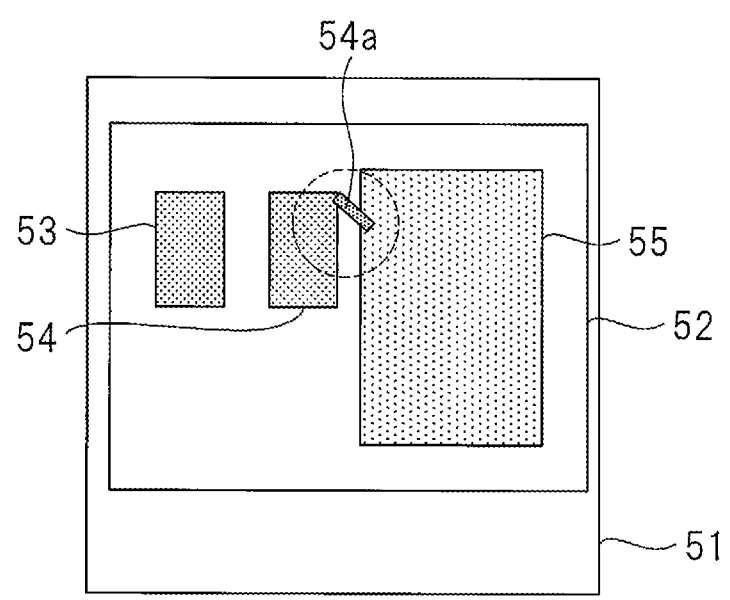

MICROSTRUCTURE MANUFACTURING METHOD AND MICROSTRUCTURE MANUFACTURING APPARATUS

CROSS-REFERENCE TO RELATED APPLICATION

The present application claims priority from Japanese Patent Application No. 2017-046223 filed on Mar. 10, 2017, the content of which is hereby incorporated by reference into this application.

TECHNICAL FIELD

The present invention relates to a microstructure manufacturing method and a microstructure manufacturing apparatus, for example, to a microstructure manufacturing method and a microstructure manufacturing apparatus for manufacturing a microstructure such as micro electro mechanical systems (MEMS).

BACKGROUND ART

PTL 1 discloses a technology for storing a set value of a timing at which a voltage is applied to a blanking electrode for each kind of gas and setting the set value of the timing corresponding to the kind of gas in the blanking electrode in a focused ion beam apparatus.

CITATION LIST

Patent Literature

PTL 1: JP-A-2011-210492

SUMMARY OF INVENTION

Technical Problem

In the technology disclosed in PTL 1 disclosed above, a timing at which a voltage is applied to a blanking electrode can be switched for each kind of gas. However, radiation of an ion beam at a position other than a desired processing position may not be avoided when the timing of the blanking is merely switched for each kind of gas using the technology of PTL 1.

An object of the invention is to provide a technology for avoiding radiation of an ion beam at a position other than a desired processing position.

The foregoing object and other objects of the invention and new characteristics of the invention will be apparent from the description of the present specification and the appended drawings.

Solution to Problem

The representative overview of the invention disclosed in the present specification will be described in brief as follows.

According to an embodiment, a microstructure manufacturing method is a microstructure manufacturing method of manufacturing a microstructure by radiating an ion beam to a sample. The microstructure manufacturing method includes: a step of radiating the ion beam to the sample; a step of supplying a gas to the sample; a step of stopping supplying the gas to the sample; and a step of stopping radiating the ion beam to the sample. The step of radiating the ion beam is performed earlier than the step of supplying the gas or the step of stopping supplying the gas is performed earlier than the step of stopping radiating the ion beam.

According to another embodiment, a microstructure manufacturing apparatus is a microstructure manufacturing apparatus that manufactures a microstructure by radiating an ion beam to a sample. The microstructure manufacturing apparatus includes a control device that performs control of radiating the ion beam to the sample, control of supplying the gas to the sample, control of stopping supplying the gas to the sample, and control of stopping radiating the ion beam to the sample. The control device performs the control of radiating the ion beam earlier than the control of supplying the gas or performs the control of stopping supplying the gas earlier than the control of stopping radiating the ion beam.

A microstructure manufacturing method according to still another embodiment is a microstructure manufacturing method of manufacturing a microstructure by radiating an ion beam to a sample. The microstructure manufacturing method includes: a step of radiating the ion beam to the sample; a step of processing the sample by radiating the ion beam to the sample; and a step of stopping radiating the ion beam to the sample. In the step of radiating the ion beam or the step of stopping radiating the ion beam, a direction in which the ion beam operates on the sample is designated from a plurality of alternatives.

Advantageous Effects of Invention

The representative advantageous effects of the invention disclosed in the present specification will be described in brief as follows.

According to an embodiment, it is possible to avoid radiation of an ion beam at a position other than a desired processing position.

BRIEF DESCRIPTION OF DRAWINGS

FIG. 1 is a diagram illustrating an example of a configuration of a device manufacturing apparatus according to a first embodiment.

FIG. 2 is an explanatory diagram illustrating an example of a software configuration of the device manufacturing apparatus in FIG. 1.

FIG. 3 is a flowchart illustrating an example of a procedure of a device manufacturing method according to the first embodiment.

FIG. 4 is a flowchart illustrating an example of a procedure of the device manufacturing method in a case of a spot beam scheme according to the first embodiment.

FIG. 5 is a flowchart illustrating an example of a procedure of the device manufacturing method in a case of a projection beam scheme according to the first embodiment.

FIGS. 6A to 6C are explanatory diagrams illustrating an example of a processing state in each step in FIG. 5.

FIG. 7 is an explanatory diagram illustrating an example of gas supply control by opening and closing a movable shutter in a device manufacturing method according to a second embodiment.

FIG. 8 is an explanatory diagram illustrating an example of a timing of the gas supply control by opening and closing the movable shutter in FIG. 7.

FIGS. 9A to 9C are explanatory diagrams illustrating an example of a processing state in each step of the device manufacturing method according to the second embodiment.

FIG. 10 is an explanatory diagram illustrating an example of blanking direction control in a device manufacturing method according to a third embodiment.

FIG. 11 is an explanatory diagram illustrating an example of suppression of a processing progress in an area other than a figure by the blanking direction control according to the third embodiment.

FIGS. 12A and 12B are explanatory diagrams illustrating an example of the structure of a blanking electrode according to the third embodiment.

FIGS. 13A and 13B are explanatory diagrams illustrating an example of a blanking operation in room for improvement.

FIGS. 14A and 14B are explanatory diagrams illustrating an example of an ion beam operation in a case in which a processing figure with a constant area is processed on a sample in the room for improvement.

FIG. 15 is an explanatory diagram illustrating an example of an upper surface SIM image of a result obtained by forming a fine line pattern of a film by an FIB for the room for improvement.

FIG. 16 is a flowchart illustrating an example of an operation procedure of FIB processing in the room for improvement.

FIG. 17 is an explanatory diagram illustrating an example in which forming of a film in an area other than a set area is a problem in the room for improvement.

DESCRIPTION OF EMBODIMENTS

Hereinafter, embodiments will be described in detail with reference to the drawings. Throughout all the drawings for describing the following embodiments, the same reference numerals are given to the same members in principle and repeated description thereof will be omitted. To facilitate the understanding of the drawings, hatching is given to even plan views and hatching is not given to even sectional views in some cases.

To facilitate understanding of features in the following embodiments, room for improvement in related technologies will be described.

[Room for Improvement]

Room for improvement will be described with reference to FIGS. 13 to 17. In content to be described in the room for improvement, examples of materials, dimensions, and the like in focused ion beam (FIB) processing are shown and embodiments are not limited thereto.

For example, in manufacturing of a microstructure such as MEMS, development of an MEMS sensor manufacturing technology used for FIB processing is ongoing. Examples of the FIB processing include etching, film forming, and adhering. Hereinafter, etching and film forming will be described.

First, a blanking operation will be described with reference to FIG. 13. FIG. 13 is an explanatory diagram illustrating an example of the blanking operation. In general, an FIB device (see FIG. 1 to be described below) controls whether to radiate an ion beam 7 to a sample 13, as illustrated in FIG. 13, by determining whether to apply a voltage to a blanking electrode 8. As illustrated in FIG. 13(a), in a blanking OFF state in which no voltage is applied to the blanking electrode 8, the ion beam 7 reaches the sample 13. As illustrated in FIG. 13(b), in a blanking ON state in which a voltage is applied to the blanking electrode 8, a path of the ion beam 7 is changed, the ion beam 7 is blocked by a beam restriction aperture 4, and thus the ion beam 7 does not reach the sample 13.

An ion beam operation in a case in which a processing figure with a constant area is processed on the sample 13 will be described with reference to FIG. 14. FIG. 14 is an explanatory diagram illustrating an example of an ion beam operation in a case in which the processing figure with a constant area is processed on a sample. As illustrated in FIG. 14, in a case in which a processing FIG. 71 with a constant area is processed on the sample 13, the ion beam 7 is subjected to blanking (blanking ON) until immediately before processing. The blanking is released only during the processing. This is common to any of the cases in which a spot beam (focused beam) scheme and a projection beam scheme are used.

In the case of the spot beam scheme, as illustrated in FIG. 14(a), a procedure is implemented as follows: (1) radiation (releasing of blanking) of the ion beam 7 to a processing start point 72 of the processing FIG. 71, (2) scanning with the ion beam 7, and (3) blanking at a processing end point 73 of the processing FIG. 71. In the case of the projection beam scheme, as illustrated in FIG. 14(b), a procedure is implemented as follows: (1) radiation (releasing of blanking) of the ion beam 7, (2) processing of the processing FIG. 71 (maintaining for a constant time), and (3) blanking.

The inventors found that blanking affects a processing shape while various patterns are processed with an FIB. FIG. 15 is an explanatory diagram illustrating an example of an upper surface SIM image of a result obtained by forming a fine line pattern of a film (for example, a $SiO_2$ film) by the FIB. As illustrated in FIG. 15, in a step of forming a film of a fine line pattern 81 in a set area on the sample 13, a film 82 with a stripe shape was formed obliquely from the upper end of the fine line pattern 81 in an area other than the set area through a blanking operation. Since the direction of the stripe of the formed film 82 matched an operation direction of the ion beam at the time of blanking, it was proven that the film 82 with the stripe shape was formed in the ion beam operation at the time of blanking ON/OFF.

FIG. 16 is a flowchart illustrating an example of an operation procedure of FIB processing (film forming). An FIB processing (film forming) operation is performed in the order of gas supply (step S401), ion beam radiation (blanking OFF) (step S402), processing by ion beam radiation (step S403), ion beam stopping (blanking ON) (step S404), and gas stopping (step S405). At the time of blanking ON/OFF, the ion beam 7 is operated in a state in which a source gas exists. Therefore, there is a possibility of a film being formed, as in FIG. 15. In particular, at the time of the ion beam radiation (blanking OFF), this problem easily occurs since it is difficult to stabilize the position of the ion beam 7 because of characteristics of a control circuit. FIG. 16 illustrates an example of gas-assisted film forming, but the same can also be said to apply gas-assisted etching.

The forming of the film in an area other than the set area due to the influence of the ion beam blanking during the FIB processing is a serious problem at the time of device manufacturing with the FIB. FIG. 17 is an explanatory diagram illustrating an example in which forming of a film in an area other than a set area is a problem. For example, as illustrated in FIG. 17, a short circuit failure occurs between electrodes when the plurality of electrodes are formed to be adjacent to each other. In FIG. 17, a film 54a with a stripe shape is formed obliquely from the upper end of an electrode (B) 54 in the direction of an electrode (C) 55 and a short circuit failure occurs between the electrodes (B) 54 and (C) 55 when the electrode (B) 54 is formed in a configuration in which an electrode (A) 53, the electrode (B)

54, and the electrode (C) 55 are formed on an insulation film 52 of a substrate (the sample 13).

The inventors have been developing an FIB device capable of using the ion beam 7 with a large current (for example, a maximum of 100 mA) in order to improve a device manufacturing throughput. Since a time in which the sample 13 is scanned with the ion beam 7 at the time of blanking is short, this phenomenon is not serious at the time of using the ion beam 7 with a small current (for example, 1 nA or less). However, an increase in a depth of etching and a thickness of a formed film in an area other than a set area is expected with an increase in a current.

In the experiment illustrated in FIG. 15, the spot beam scheme was used. Therefore, the film with the stripe shape was formed due to the influence of the blanking. However, in a case in which the projection beam scheme is used, a film with a film figure directly dragged to an area other than the set area is expected be formed.

Accordingly, in the embodiment, room for improvement in the above-described related technology has been devised. Hereinafter, technical ideas devised according the embodiments will be described with reference to the drawings. The technical ideas according to the embodiments provide a technology for avoiding radiation of the ion beam 7 to an area other than a desired processing position. More specifically, the technical ideas provide a technology for suppressing the progress of processing in an area other than a set area in a blanking operation during FIB processing.

[First Embodiment]

A first embodiment will be described with reference to FIGS. 1 to 6. In the first embodiment, an MEMS structure (MEMS element), particularly, an MEMS sensor, will be described as an example of a device. However, the invention can also be applied to other sensors such as other microstructures.

<Device Manufacturing Apparatus>

A device manufacturing apparatus according to the first embodiment will be described with reference to FIGS. 1 and 2. FIG. 1 is a diagram illustrating an example of a configuration of a device manufacturing apparatus according to the first embodiment.

The device manufacturing apparatus according to the embodiment includes an FIB device illustrated in FIG. 1. The FIB device includes a vacuum vessel 1. In the vacuum vessel 1, an ion beam radiation system including an ion source 2 that emits ions, a condenser lens 3, blanking electrodes 8, a beam restriction aperture 4, an ion beam scanning deflector 5, and an aperture rotation mechanism 6 is disposed. An ion beam 7 is radiated from the ion beam radiation system. A part of the ion beam radiation system is also referred to as an FIB barrel 18.

For example, the ion source 2 includes a liquid metal ion source and a plasma ion source. The liquid metal ion source emits gallium ions to radiate the gallium ions as a gallium ion beam from the ion beam radiation system. The plasma ion source emits argon ions or xenon ions to radiate the argon ions or the xenon ions as an argon ion beam or a xenon ion beam from the ion beam radiation system.

In the FIB device, an electron beam radiation system including an electron gun 9, and an electron lens 11 and an electron beam scanning deflector 12 focusing an electron beam 10 emitted from the electron gun 9 is disposed. In the FIB device, a sample 13, a secondary particle detector 14, a sample stage 15, a probe (manipulator) 16, and a gas source 17 introducing a source gas (deposit gas) at the time of film forming or a gas for accelerating etching at the time of cutting into the vacuum vessel 1 are further disposed. Here, the sample 13 is a substrate such as a semiconductor wafer on which a plurality of MEMS structures (MEMS elements) are formed.

In this way, the device manufacturing apparatus according to the embodiment includes the ion beam radiation system and the secondary particle detector 14, and thus the secondary particle detector 14 can be used to acquire a scanning ion microscope (SIM) image. The device manufacturing apparatus according to the embodiment also includes the electron beam radiation system, and thus the secondary particle detector 14 can also be used to acquire a scanning electron microscope (SEM) image.

The device manufacturing apparatus according to the embodiment includes a sample stage control device 21, a manipulator control device 22, a gas source control device 23, a secondary particle detector control device 24, an aperture rotation control device 25, an ion source control device 26, a lens control device 27, a blanking control device 28, a computing device 31, and a storage device storing a database 32 as control devices controlling the FIB device. The control devices 21 to 28 perform control in response to instructions from the computing device 31. The device manufacturing apparatus according to the embodiment includes a computer including a computing device 31 and the storage device storing the database 32.

The sample stage 15 includes a linear movement mechanism in two directions orthogonal on a sample placement surface, a linear movement mechanism in a direction perpendicular to the sample placement surface, a rotational mechanism on the sample placement surface, and a tilting mechanism has a tilting axis on the sample placement surface. The control is performed in the sample stage control device 21 in response to an instruction from the computing device 31.

The computing device 31 includes information input means for inputting information necessary for a device user and a display that displays an image generated on the basis of a detected signal of the secondary particle detector 14, information input by the information input means, and the like. The information input means includes, for example, a mode input unit 34 illustrated in FIG. 2, as will be described below. The display displays, for example, a mode selection screen 33 or the like illustrated in FIG. 2, as will be described below. The computing device 31 realizes a software function unit such as a central control unit 35 illustrated in FIG. 2, as will be described below. The database 32 stores, for example, a structure library 32a, computer-aided design (CAD) data 32b, and processing condition data 32c, and the like illustrated in FIG. 2, as will be described below.

In the FIB device, ions emitted from the ion source 2 are focused as the ion beam 7 on the sample 13 by the condenser lens 3 and an objective lens. A convergence condition is set by inputting the focusing condition to the computing device 31. A beam diameter of the ion beam 7 radiated onto the sample 13 is determined in accordance with an image formed on the sample 13 at the time of setting the ion source 2 as a light source and aberration by the condenser lens 3 or the like. The aberration by the condenser lens 3 or the like increases as an opening of the beam restriction aperture 4 increases, and thus the beam diameter is expanded.

In the FIB device, blanking control is performed by the blanking control device 28. The blanking control device 28 controls whether to radiate the ion beam 7 to the sample 13 or whether to apply a voltage to the blanking electrodes 8. In a blanking OFF state in which no voltage is applied to the blanking electrodes 8, the ion beam 7 reaches the sample 13 (see FIG. 13(a) described above). In a blanking ON state in which a voltage is applied to the blanking electrodes 8, a path of the ion beam 7 is changed, the ion beam 7 is blocked by the beam restriction aperture 4, and thus the ion beam 7 does not reach the sample 13 (see FIG. 13(*b*) described above).

Next, a software configuration of the above-described device manufacturing apparatus will be described with reference to FIG. 2. FIG. 2 is an explanatory diagram illustrating an example of the software configuration of the device manufacturing apparatus.

As illustrated in FIG. 2, the FIB device of the device manufacturing apparatus includes the database 32, the mode selection screen 33, the mode input unit 34, the central control unit 35, a beam control unit 37 that performs control based on beam control data 36, the gas source control device 23 that performs control based on the gas control data 38, and the sample stage control device 21 that performs control based on positional information. The beam control unit 37 is, for example, the aperture rotation control device 25, the ion source control device 26, the lens control device 27, the blanking control device 28, and the like illustrated in FIG. 1. The beam control unit 37 performs control of radiating the ion beam 7 to the sample 13 and performs control of stopping radiating the ion beam 7 to the sample 13. The gas source control device 23 performs control of supplying the gas to the sample 13 and performs control of stopping supplying the gas to the sample 13. Further, the beam control unit 37 and the gas source control device 23 perform control of processing the sample 13 by radiating the ion beam 7 to the sample 13 to which the gas is supplied.

The central control unit 35 has a processing control program to construct a software configuration of the device manufacturing apparatus. The processing control program includes, for example, not only a program that automatically performs device processing but also programs for blanking control, gas supply ON/OFF control, ion beam radiation ON/OFF control, and the like.

The database 32 stores various kinds of data. For example, the structure library 32*a*, the CAD data 32*b* such as design data of the shape and dimensions of the MEMS structure, and the processing condition data 32*c* such as a processing position, a processing condition, and the like of the MEMS structure are stored.

For example, in the device manufacturing apparatus, the structure library 32*a*, the CAD data 32*b*, and the processing condition data 32*c* are input from the information input means of the computing device 31 by an operator and are stored in the database 32 before the device processing is performed.

At the time of the device processing, the operator selects a device manufacturing method from the mode input unit 34 of the computing device 31 on the mode selection screen 33. The device manufacturing method includes a device manufacturing method (see FIGS. 3 to 6) according to the first embodiment, a device manufacturing method (see FIGS. 7 to 9) according to a second embodiment to be described below, and a device manufacturing method (see FIGS. 10 to 12) according to a third embodiment to be described below. In the selection of the device manufacturing method, the kind of gas, the processing position, and material information (the CAD data and the processing condition data) is designated or selection of the spot beam scheme or the projection beam scheme is also designated.

The central control unit 35 of the computing device 31 generates the beam control data 36 and the gas control data 38 with reference to the structure library 32*a*, the CAD data 32*b*, and the processing condition data 32*c* in the database 32 based on a sequence of the device manufacturing method selected on the mode selection screen 33.

The beam control data 36 and the gas control data 38 generated by the central control unit 35 are sent to the beam control unit 37 and the gas source control device 23, respectively. Then, the beam control unit 37 controls the ion beam radiation system disposed in the FIB barrel 18 of the FIB device based on the beam control data 36. The gas source control device 23 controls the gas source 17 based on the gas control data 38. At this time, the sample stage control device 21 controls the sample stage 15 based on the positional information included in the processing condition data 32*c*.

At the time of device processing, the processing shape of the SIM image acquired by the secondary particle detector 14 is stored as the CAD data 32*b* in the database 32. Based on the CAD data 32*b*, the central control unit 35 performs feedback to the sample stage control device 21, the beam control unit 37, and the gas source control device 23.

In this way, in the device manufacturing apparatus according to the embodiment, the MEMS structure can be automatically formed when the designation such as selection of the device manufacturing method is received. In this case, on a screen by a control program of the FIB device, a screen for the gas supply ON/OFF and a screen for the beam radiation ON/OFF can be displayed.

<Device Manufacturing Method>

A device manufacturing method according to the first embodiment will be described with reference to FIGS. 3 to 6. FIG. 3 is a flowchart illustrating an example of a procedure of the device manufacturing method according to the first embodiment. FIG. 4 is a flowchart illustrating an example of a procedure of the device manufacturing method in a case of the spot beam scheme. FIG. 5 is a flowchart illustrating an example of a procedure of the device manufacturing method in a case of the projection beam scheme. FIG. 6 is an explanatory diagram illustrating an example of a processing state in each step in FIG. 5.

The device manufacturing method according to the first embodiment can be realized by executing a processing control program that constructs the software configuration of the device manufacturing apparatus described above (see FIG. 2) as the device manufacturing apparatus including the FIB device described above (see FIG. 1).

In the FIB processing (film forming and etching), as illustrated in FIG. 16 described above, a cause for progress of the processing in an area other than the set area is to supply an assist gas to the sample 13 at the time of blanking. Accordingly, in the embodiment, as illustrated in FIG. 3, it is possible to resolve the problem described in the above-described room for improvement by changing the flow to a flow in which the gas is supplied after ion beam radiation (blanking OFF) and the ion beam is stopped (blanking ON) after the stop of the gas.

That is, in the device manufacturing method according to the embodiment, as illustrated in FIG. 3, the FIB device first radiates the ion beam 7 to the sample 13 (step S101). Step S101 is performed under the blanking control. Step S101 is performed in the blanking OFF state in which no voltage is applied to the blanking electrodes 8 under the control of the blanking control device 28, and radiation of the ion beam 7 to the sample 13 is started. In the blanking OFF state, since there is no influence of the blanking electrodes 8, the ion beam 7 reaches the sample 13.

Subsequently, the FIB device supplies the gas to the sample 13 (step S102). In step S102, supply of the gas from the gas source 17 to the sample 13 is started under the control of the gas source control device 23. Step S102 is performed by controlling a supply direction of the gas.

Subsequently, the FIB device processes the sample 13 by radiating the ion beam 7 to the sample 13 to which the gas is supplied (step S103). In step S103, the sample 13 is processed by being scanned with the ion beam 7 under the control of the beam control unit 37 while supplying the gas from the gas source 17 under the control of the gas source control device 23.

Subsequently, the FIB device stops supplying the gas to the sample 13 (step S104). In step S104, the supply of the gas from the gas source 17 to the sample 13 is ended under the control of the gas source control device 23. Step S104 is performed by controlling the supply direction of the gas.

Subsequently, the FIB device stops radiating the ion beam 7 to the sample 13 (step S105). Step S105 is performed under the blanking control. Step S105 is performed in the blanking ON state in which the voltage is applied to the blanking electrodes 8 under the control of the blanking control device 28, and the radiation of the ion beam 7 to the sample 13 is ended. In the blanking ON state, since there is the influence of the blanking electrodes 8, the path of the ion beam 7 is changed, the ion beam 7 is blocked by the beam restriction aperture 4, and the ion beam 7 does not reach the sample 13.

In this way, in the device manufacturing method according to the embodiment, step S101 of radiating the ion beam is performed earlier than step S102 of supplying the gas and step S104 of stopping supplying the gas is performed earlier than step S105 of stopping radiating the ion beam. However, in the device manufacturing method according to the embodiment, the invention is not limited to a case in which both the former and the latter are established. The invention can also be applied to a case in which one of the former and the latter is established. That is, step S101 of radiating the ion beam is performed earlier than step S102 of supplying the gas or step S104 of stopping supplying the gas is performed earlier than step S105 of stopping radiating the ion beam.

In this procedure, etching is in progress when the ion beam 7 is radiated to the sample 13 in the state in which no gas is supplied. However, it is possible to avoid occurrence of a short circuit failure as in FIG. 17 described above. Since the film formed immediately previously by radiating the ion beam 7 is etched, adjustment is necessary so that a desired film thickness can be obtained after the etching. In the adjustment, it is effective to register the etching amount in advance in data of a film forming rate contained in the database 32 of the device manufacturing apparatus.

Hereinafter, the device manufacturing method according to the embodiment will be described in detail. The device manufacturing method according to the embodiment can be applied to a case in which either the spot beam scheme or the projection beam scheme is used. The spot beam scheme is a focused beam scheme of forming a film by performing scanning with the ion beam 7 focused on the sample 13. The projection beam scheme is a projection beam scheme of forming a film by projecting the ion beam 7 with the shape of a mask figure to the sample 13 using a film forming mask. Both the operation flows will be described with reference to the foregoing steps S101 to S105.

In the procedure of the device manufacturing method in the case of the spot beam scheme, as illustrated in FIG. 4, the FIB device first radiates the ion beam 7 to a processing start point of the sample 13 (step S201). In step S201, radiation of the ion beam 7 to the sample 13 is started as in the foregoing step S101.

Subsequently, the FIB device supplies the gas to the sample 13 (step S202). In step S202, the supply of the gas from the gas source 17 to the sample 13 is started as in the foregoing step S102.

Subsequently, as in the foregoing step S103, the FIB device processes the sample 13 in step S203 of processing the sample 13 (step S203) by radiating the ion beam 7 while scanning the sample 13 to which the gas is supplied, with the ion beam 7 (first round).

Subsequently, when the scanning (first round) with the ion beam 7 reaches a processing endpoint of the sample 13 (step S204), the FIB device stops supplying the gas to the sample 13 (step S205). In step S205, the supply of the gas from the gas source 17 to the sample 13 is ended as in the foregoing step S104.

Subsequently, the FIB device stops radiating the ion beam 7 to the sample 13 (step S206). In step S206, the radiation of the ion beam 7 to the sample 13 is ended as in the foregoing step S105.

As described above, the processing of the sample 13 in the first scanning with the ion beam 7 is ended. Subsequently, the processing in the case of the spot beam scheme is completed by performing steps S207 to S212 as in the foregoing steps S201 to S206 and subsequently repeating the scanning a predetermined number of times. In this way, in the case of the spot beam scheme, the blanking is generally performed whenever the processing figure is scanned once.

In the procedure of the device manufacturing method in the case of the projection beam scheme, as illustrated in FIG. 5, the FIB device first radiates the ion beam 7 to the sample 13 (step S301). In step S301, the radiation of the ion beam 7 to the sample 13 is started as in the foregoing step S101.

Subsequently, the FIB device supplies the gas to the sample 13 (step S302). In step S302, the supply of the gas from the gas source 17 to the sample 13 is started as in the foregoing step S102.

Subsequently, the FIB device processes the sample 13 by radiating the ion beam 7 to the sample 13 to which the gas is supplied (step S303). In step S303, the sample 13 is processed as in the foregoing step S103. In step S303, the position of the ion beam 7 is not moved unlike the case of the spot beam scheme. That is, in the projection beam scheme, the ion beam 7 with the shape of the mask figure is projected onto the sample 13 using the film forming mask.

Subsequently, the FIB device stops supplying the gas to the sample 13 (step S304). In step S304, the supply of the gas from the gas source 17 to the sample 13 is ended as in the foregoing step S104.

Subsequently, the FIB device stops radiating the ion beam 7 to the sample 13 (step S305). In step S305, the radiation of the ion beam 7 to the sample 13 is ended as in the foregoing step S105.

The processing in the case of the projection beam scheme is completed, as described above. In this way, in the case of the projection beam scheme, once the radiation of the ion beam 7 is started, the radiation of the ion beam 7 is maintained before the processing is ended.

In the device manufacturing method in the case of the projection beam scheme, for example, a processing state in each step illustrated in FIG. 6 is realized. In the example of FIG. 6, the foregoing steps S303 to S305 are illustrated. In the foregoing step S303, as illustrated in FIG. 6(a), a film 44 is formed on the sample 13 by radiating the ion beam 7 with the shape of the mask figure as projection ions using a film forming mask 43 to the sample 13 to which a gas 42 is supplied from a gas supply nozzle 41 of the gas source 17. In the foregoing step S304, as illustrated in FIG. 6(b), the supply of the gas 42 from the gas supply nozzle 41 of the gas source 17 to the sample 13 is ended. In the foregoing step S305, as illustrated in FIG. 6(c), the radiation of the ion beam 7 to the sample 13 is ended. Thus, the film 44 is formed on the sample 13.

As described above, by starting the supply of the gas after the radiation of the ion beam starts in the procedure of the ion beam radiation and the gas supply, it is possible to suppress the processing in an area other than the set area. Here, in practice, it takes some time (for example, about several tens of ms to several hundreds of ms) to stably supply the gas to the surface of the sample from the supply start of the gas (opening of a gas valve). Therefore, even when the gas valve is opened and the radiation of the ion beam is started for, for example, several ms, it is expected that the processing in an area other than the set area rarely occurs.

According to the above-described first embodiment, it is possible to suppress the progress of the processing in an area other than the set area through the blanking operation during the FIB processing (film forming and etching). Thus, it is possible to resolve the problem that the processing is in progress in an area other than the set area due to the influence of the blanking operation during the FIB processing. That is, it is possible to avoid the radiation of the ion beam 7 in an area other than a desired processing position.

[Second Embodiment]

A second embodiment will be described with reference to FIGS. 7 to 9. In the second embodiment, a device manufacturing apparatus is the same as that of the first embodiment (see FIGS. 1 and 2), and thus the description thereof herein will be omitted. In the second embodiment, a device manufacturing method different from that of the foregoing first embodiment will be mainly described.

<Device Manufacturing Method>

The device manufacturing method according to the second embodiment will be described with reference to FIGS. 7 to 9. FIG. 7 is an explanatory diagram illustrating an example of gas supply control by opening and closing a movable shutter in a device manufacturing method according to a second embodiment. FIG. 8 is an explanatory diagram illustrating an example of a timing of the gas supply control by opening and closing the movable shutter in FIG. 7. FIG. 9 is an explanatory diagram illustrating an example of a processing state in each step of the device manufacturing method according to the second embodiment.

In the foregoing first embodiment, the method of starting/ending the gas supply has not been described, but the method has further been improved in the second embodiment. In a general FIB device, the gas supply control is performed by opening and closing a valve. It takes some time to open the valve, fill the gas supply nozzle 41 with the gas 42, and stabilize a supply amount of gas in the sample 13 (for example, a standby time in units of several seconds is necessary). Even when the gas supply ends, it also takes some time to open the gas 42 in the gas supply nozzle 41.

In the second embodiment, however, as illustrated in FIG. 7, a movable shutter 46 is installed between the gas supply nozzle 41 and the sample 13 and ON/OFF of the gas supply is controlled by opening and closing the movable shutter 46. The step of supplying the gas and the step of stopping supplying the gas are performed through an operation of the movable shutter 46. The operation of opening and closing the movable shutter 46 is performed by a movable shutter control device 47. The movable shutter control device 47 is connected to, for example, the above-described computing device 31 illustrated in FIG. 1 and functions as a control device that controls the FIB device.

When ON/OFF of the gas supply is controlled through the operation of the movable shutter 46, the gas supply nozzle 41 is normally filled with the gas 42. Therefore, as illustrated in FIG. 8, ON/OFF of the gas supply can be accelerated. As illustrated in FIG. 8, in a movable shutter scheme, a time necessary until a gas supply amount reaches a gas supply amount at the time of processing is earlier than in a valve opening and closing scheme when a gas supply starting command is executed. When a gas supply ending command is executed after the processing, a time necessary until the gas supply amount reaches zero is earlier than in the valve opening and closing scheme. At this time, a time necessary for the processing (film forming) is the same in both the schemes. Thus, it is possible to accelerate ON/OFF of the gas supply by executing the gas supply starting command/ gas supply ending command.

In FIG. 7, the movable shutter 46 and the gas supply nozzle 41 are preferably disposed to be separated from each other and the movable shutter 46 is preferably not in contact with the gas supply nozzle 41. The reason for this is to avoid a change in the temperature of the gas supply nozzle 41 or the gas 42 due to the contact with the movable shutter 46 since the gas 42 of which the temperature increases is used in the FIB device.

In the device manufacturing method according to the second embodiment, for example, a processing state of each step illustrated in FIG. 9 is realized. In the example of FIG. 9, as illustrated in FIG. 9(a), the film 44 is formed on the sample 13 by radiating the ion beam 7 as projection ions to the sample 13 to which the gas 42 is supplied from the gas supply nozzle 41 in a state in which the movable shutter 46 is opened. As illustrated in FIG. 9(b), the supply of the gas 42 from the gas supply nozzle 41 to the sample 13 is ended by closing the movable shutter 46. As illustrated in FIG. 9(c), the radiation of the ion beam 7 to the sample 13 is ended. Thus, the film 44 is formed on the sample 13.

Even in the above-described second embodiment, it is possible to suppress the progress of the processing in the area other than the set area through the blanking operation during the FIB processing (the film forming and the etching) as in the foregoing first embodiment. In particular, in the second embodiment, by installing the movable shutter 46 between the gas supply nozzle 41 and the sample 13, it is possible to accelerate ON/OFF of the gas supply by opening and closing the movable shutter 46.

[Third Embodiment]

A third embodiment will be described with reference to FIGS. 10 to 12. In the third embodiment, a device manufacturing apparatus is different from that according to the foregoing first embodiment (see FIGS. 1 and 2) in a structure of blanking electrodes. Further, a device manufacturing method according to the third embodiment is different. In the third embodiment, the device manufacturing method and the structure of the blanking electrodes different from those according to the foregoing first embodiment will be mainly described.

<Device Manufacturing Method>

The device manufacturing method according to the third embodiment will be described with reference to FIGS. 10 to 12. FIG. 10 is an explanatory diagram illustrating an example of blanking direction control in the device manufacturing method according to the third embodiment. FIG. 11 is an explanatory diagram illustrating an example of suppression of a processing progress in an area other than a figure by the blanking direction control according to the third embodiment. FIG. 12 is an explanatory diagram illustrating an example of the structure of the blanking electrodes according to the third embodiment.

The third embodiment is different from the approach of the foregoing first and second embodiments in that processing at the time of blanking has no adverse influence on processing the time of device manufacturing by controlling a direction in which the ion beam 7 operates on the sample 13 at the time of blanking. That is, in the third embodiment, in the step of radiating the ion beam 7 or the step of stopping radiating the ion beam 7, a direction in which the ion beam 7 operates on the sample 13 is designated from a plurality of alternatives. The alternative of the direction in which the ion beam 7 operates on the sample 13 is designated by arbitrarily setting a voltage to be applied to each of a plurality of blanking electrodes 8 (8a and 8b) of the ion beam 7.

In the third embodiment, for example, as illustrated in FIG. 10, the direction of the blanking is controlled such that a film formed at the time of blanking is formed in an area which does not interfere with peripheral electrodes or the like. In FIG. 17 described above, a short circuit failure occurs between the electrodes (B) 54 and (C) 55 in a configuration in which the electrodes (A) 53, (B) 54, and (C) 55 are formed on the insulation film 52 of the substrate 51 (the sample 13). In the third embodiment, however, as illustrated in FIG. 10, by controlling the direction of the blanking such that a film 54a with a stripe shape is formed obliquely in an opposite direction to the electrode (C) 55 from the upper end of the electrode (B) 54 at the time of forming the electrode (B) 54, it is possible to avoid a defect of device characteristics due to the short circuit between the electrodes (B) 54 and (C) 55.

For example, as illustrated in FIG. 11, when an ion beam operation line at the time of blanking is set to be included in a processing FIG. 61, there is no concern of the processing being progressed in an area other than the processing figure. As illustrated in FIG. 11, at the time of releasing the blanking in which the ion beam 7 is radiated to a processing start point 62 of the processing FIG. 61, an inward direction of an ion beam scan area 63 is set to a blanking direction 64 at the processing start point 62. Even at the time of blanking at a processing end point 65, an inward direction of the ion beam scan area 63 is set to a blanking direction 66 at the processing end point 65. In this method, it is also possible to suppress the progress of the processing to the area other than the processing figure.

To control the direction of the blanking, the structure of the blanking electrode 8 (see FIG. 1 described above) of the FIB device may be changed. In a general FIB device, since a pair of parallel plate electrodes are used as the blanking electrodes 8, the ion beam 7 can be operated only in a constant direction. In the third embodiment, however, for example, as illustrated in FIG. 12 (FIG. 12(a) is a top view and FIG. 12(b) is a bird's eye view), a mechanism is realized in such a manner that two parallel plate blanking electrodes 8a and 8b are disposed in a traveling direction (the Z direction) of the ion beam 7, the ion beam 7 is operated in the X direction with the upper blanking electrode 8a, and the ion beam 7 is operated in the Y direction with the lower blanking electrode 8b. Thus, by controlling an application voltage of both the blanking electrodes 8a and 8b at the time of blanking, it is possible to operate the ion beam 7 in any direction.

In the above-described third embodiment, it is possible to suppress the progress of the processing in an area other than the set area through the blanking operation during the FIB processing (the film forming and the etching) as in the foregoing first embodiment. In particular, in the third embodiment, by controlling the direction in which the ion beam 7 is operated on the sample 13 at the time of blanking, the processing at the time of blanking may not have an adverse influence on the processing at the time of device manufacturing unlike the approach in the foregoing first and second embodiments.

[Appendixes]

The invention has the following features in addition to the features described in the claims.

(1) A microstructure manufacturing apparatus that manufactures a microstructure by radiating an ion beam to a sample, the apparatus including:

a control device that performs control of radiating the ion beam to the sample, control of processing the sample by radiating the ion beam to the sample, and control of stopping radiating the ion beam to the sample, wherein the control device performs the control of radiating the ion beam or the control of stopping radiating the ion beam such that a direction in which the ion beam operates on the sample is designated from a plurality of alternatives.

(2) The microstructure manufacturing apparatus described in (1), wherein the alternative of the direction in which the ion beam operates on the sample is realized by setting a voltage to be applied to each of a plurality of blanking electrodes of the ion beam.

(3) A microstructure processing control program for manufacturing a microstructure by radiating an ion beam to a sample, the program causing a computer to perform:

a step of radiating the ion beam to the sample;

a step of supplying a gas to the sample;

a step of stopping supplying the gas to the sample; and a step of stopping radiating the ion beam to the sample, wherein the step of radiating the ion beam is performed earlier than the step of supplying the gas or the step of stopping supplying the gas is performed earlier than the step of stopping radiating the ion beam.

(4) A microstructure processing control program for manufacturing a microstructure by radiating an ion beam to a sample, the program causing a computer to perform:

a step of radiating the ion beam to the sample;

a step of processing the sample by radiating the ion beam to the sample; and a step of stopping radiating the ion beam to the sample, wherein in the step of radiating the ion beam or the step of stopping radiating the ion beam, a direction in which the ion beam operates on the sample is designated from a plurality of alternatives.

The invention devised by the inventors has been specifically described based on the embodiments, but the invention is not limited to the foregoing embodiments and can, of course, be modified in various forms within the scope of the invention without departing from the gist of the invention.

For example, in the foregoing embodiments, the MEMS structure (MEMS element) has been described as an example of the device, but can also be applied to other microstructures. The MEMS sensor has been described as an example of the MEMS structure, but the invention can be applied to other sensors or the like.

The invention is not limited to the foregoing embodiments, but includes various modification examples. For example, the foregoing embodiments have been described in detail to facilitate the description of the invention and are not necessarily limited to those including all the described configurations.

Apart of the configuration according to a certain embodiment can be substituted with the configuration of another embodiment and the configuration of another embodiment can also be added to the configuration of a certain embodiment. A part of the configuration according to each embodiment can be added to, deleted from, or substituted with another configuration.

REFERENCE SIGNS LIST 1 vacuum vessel
2 ion source
7 ion beam
8, 8a, 8b blanking electrode
9 electron gun
10 electron beam
13 sample
14 secondary particle detector
15 sample stage
16 probe
17 gas source
18 FIB barrel
21 sample stage control device
22 manipulator control device
23 gas source control device
24 secondary particle detector control device
25 aperture rotation control device
26 ion source control device
27 lens control device
28 blanking control device
31 computing device
32 database
32a structure library
32b CAD data
32c processing condition data
33 mode selection screen
34 mode input unit
35 central control unit
36 beam control data
37 beam control unit
38 gas control data
41 gas supply nozzle
42 gas
43 film forming mask
44 film
46 movable shutter
47 movable shutter control device
51 substrate
52 insulation film
53 to 55 electrode
54a film
61 processing figure
62 processing start point
63 ion beam scan area
64 blanking direction
65 processing end point
66 blanking direction

The invention claimed is:

1. A microstructure manufacturing method of manufacturing a microstructure by radiating an ion beam to a sample, the method comprising:
a step of radiating the ion beam to the sample;
a step of supplying a gas to the sample;
a step of stopping supplying the gas to the sample; and
a step of stopping radiating the ion beam to the sample,
wherein the step of radiating the ion beam is performed earlier than the step of supplying the gas or the step of stopping supplying the gas is performed earlier than the step of stopping radiating the ion beam, and
wherein the step of supplying the gas and the step of stopping supplying the gas are performed by controlling a supply direction of the gas.

2. The microstructure manufacturing method according to claim 1, further comprising:
a step of processing the sample by radiating the ion beam to the sample to which the gas is supplied.

3. The microstructure manufacturing method according to claim 1,
wherein the step of radiating the ion beam and the step of stopping radiating the ion beam are performed under blanking control.

4. The microstructure manufacturing method according to claim 1,
wherein the ion beam is a projection beam formed using a film forming mask.

5. A microstructure manufacturing method of manufacturing a microstructure by radiating an ion beam to a sample, the method comprising:
a step of radiating the ion beam to the sample;
a step of supplying a gas to the sample;
a step of stopping supplying the gas to the sample; and
a step of stopping radiating the ion beam to the sample,
wherein the step of radiating the ion beam is performed earlier than the step of supplying the gas or the step of stopping supplying the gas is performed earlier than the step of stopping radiating the ion beam, and
wherein the step of supplying the gas and the step of stopping supplying the gas are performed through an operation of a movable shutter disposed between a gas supply nozzle and the sample.

6. A microstructure manufacturing apparatus that manufactures a microstructure by radiating an ion beam to a sample, the apparatus comprising:
a control device that performs control of radiating the ion beam to the sample, control of supplying the gas to the sample, control of stopping supplying the gas to the sample, and control of stopping radiating the ion beam to the sample,
wherein the control device performs the control of radiating the ion beam earlier than the control of supplying the gas or performs the control of stopping supplying the gas earlier than the control of stopping radiating the ion beam, and
wherein the control of supplying the gas and the control of stopping supplying the gas are performed by controlling a supply direction of the gas.

7. The microstructure manufacturing apparatus according to claim 6,
wherein the control device further performs control of processing the sample by radiating the ion beam to the sample to which the gas is supplied.

8. The microstructure manufacturing apparatus according to claim 6,
wherein the control of radiating the ion beam and the control of stopping radiating the ion beam are performed under blanking control.

9. The microstructure manufacturing apparatus according to claim 6,
wherein the ion beam is a projection beam formed using a film forming mask.

10. A microstructure manufacturing apparatus that manufactures a microstructure by radiating an ion beam to a sample, the apparatus comprising:

a control device that performs control of radiating the ion beam to the sample, control of supplying the gas to the sample, control of stopping supplying the gas to the sample, and control of stopping radiating the ion beam to the sample, wherein the control device performs the control of radiating the ion beam earlier than the control of supplying the gas or performs the control of stopping supplying the gas earlier than the control of stopping radiating the ion beam, wherein the control of supplying the gas and the control of stopping supplying the gas are performed through an operation of a movable shutter disposed between a gas supply nozzle and the sample.

11. The microstructure manufacturing apparatus according to claim 10, wherein the movable shutter and the gas supply nozzle are disposed to be separated from each other.

* * * * *